(12) United States Patent
Lee et al.

(10) Patent No.: US 9,142,682 B2
(45) Date of Patent: Sep. 22, 2015

(54) THIN FILM TRANSISTOR AND MANUFACTURING METHOD THEREOF

(71) Applicant: Samsung Display Co., Ltd., Yongin (KR)

(72) Inventors: Je Hun Lee, Seoul (KR); Ji Hun Lim, Goyang-si (KR); Jun Ho Song, Seongnam-si (KR)

(73) Assignee: Samsung Display Co., Ltd., Yongin (KR)

( * ) Notice: Subject to any disclaimer, the term of this patent is extended or adjusted under 35 U.S.C. 154(b) by 14 days.

(21) Appl. No.: 13/826,905

(22) Filed: Mar. 14, 2013

(65) Prior Publication Data

US 2014/0061631 A1 Mar. 6, 2014

(30) Foreign Application Priority Data

Sep. 5, 2012 (KR) .................. 10-2012-0098276

(51) Int. Cl.
*H01L 29/786* (2006.01)
*H01L 29/66* (2006.01)

(52) U.S. Cl.
CPC ...... *H01L 29/7869* (2013.01); *H01L 29/66969* (2013.01); *H01L 29/78696* (2013.01)

(58) Field of Classification Search
CPC ................ H01L 29/7869; H01L 29/78693
USPC ......... 257/43, E21.409, E29.068, E29.29, 49, 257/59; 438/158, 159
See application file for complete search history.

(56) References Cited

U.S. PATENT DOCUMENTS

| | | | |
|---|---|---|---|
| 6,197,625 B1 | 3/2001 | Choi | |
| 8,143,678 B2 | 3/2012 | Kim et al. | |
| 8,158,976 B2 | 4/2012 | Son et al. | |
| 2010/0072470 A1 | 3/2010 | Yamazaki et al. | |
| 2011/0017993 A1* | 1/2011 | Tsuda et al. | 257/57 |
| 2011/0215328 A1* | 9/2011 | Morosawa et al. | 257/59 |
| 2012/0049183 A1* | 3/2012 | Yamazaki | 257/43 |
| 2012/0061663 A1 | 3/2012 | Yamazaki et al. | |
| 2012/0168743 A1* | 7/2012 | Lee et al. | 257/43 |
| 2013/0207111 A1* | 8/2013 | Yamazaki | 257/57 |

FOREIGN PATENT DOCUMENTS

| | | |
|---|---|---|
| KR | 10-2011-0124585 | 11/2011 |
| WO | 2009/028453 | 3/2009 |

OTHER PUBLICATIONS

Jae Chul Park, et al., "Highly Stable Transparent Amorphous Oxide Semiconductor Thin-Film Transistor Having Double-Stacked Active Layers," Oct. 22, 2010, pp. 5512-5516, published on line www.Advmat.de, Wiley-VCH Verlag Gmbh & Co. KGaA, Weinheim, Germany.

(Continued)

*Primary Examiner* — Stephen W Smoot
*Assistant Examiner* — Edward Chin
(74) *Attorney, Agent, or Firm* — H.C. Park & Associates, PLC

(57) ABSTRACT

A thin film transistor and a manufacturing method thereof. The thin film transistor includes: a gate electrode; a gate insulating layer disposed on the gate electrode; a first semiconductor disposed on the gate insulating layer; a second semiconductor disposed on the first semiconductor and having a different plane shape from the first semiconductor; and a source electrode and a drain electrode that are disposed on the second semiconductor and face each other.

16 Claims, 13 Drawing Sheets

(56) References Cited

OTHER PUBLICATIONS

W. J. Maeng, et al., "Photo and thermal stability enhancement of amorphous Hf-In-Zn-O thin-film transistors by the modulation of back channel composition," Feb. 16, 2011, pp. 073503-073503, Applied Physics Letters, vol. 98, American Institute of Physics.

W. J. Maeng, et al., "The Effect of Active-Layer Thickness and Back-Channel Conductivity on the Subthreshold Transfer Characteristics of Hf-In-Zn-O TFTs," Aug. 2011, pp. 1077-1079, IEEE Electron device letters, vol. 32., No. 8.

Jae Chul Park, et al., "High-performance amorphous gallium indium zinc oxide thin-film transistors through N2O plasma passivation," Aug. 7, 2008, pp. 053505-053503, Applied Physics Letters, vol. 93, American Institute of Physics.

Hideya Kumomi, et al., "Materials, Devices, and Circuits of Transparent Amorphous-Oxide Semiconductor," Dec. 2009, pp. 531-540, Journal of Display Technology, vol. 5, No. 12.

* cited by examiner

THIN FILM TRANSISTOR AND MANUFACTURING METHOD THEREOF

CROSS-REFERENCE TO RELATED APPLICATION

This application claims priority to and the benefit of Korean Patent Application No. 10-2012-0098276, filed on Sep. 5, 2012, which is hereby incorporated by reference for all purposes as if fully set forth herein.

BACKGROUND

1. Field

Exemplary embodiments of the present invention relate to a thin film transistor and a manufacturing method thereof, and more particularly, to a thin film transistor including an oxide semiconductor and a manufacturing method thereof.

2. Discussion of the Background

Electronic elements such as a resistor, a capacitor, a diode, and a thin film transistor are used in various fields, and among them, the thin film transistor (TFT) is used as switching and driving elements in a flat panel display such as a liquid crystal display (LCD), an organic light emitting diode display (OLED display), and an electrophoretic display.

The thin film transistor includes a gate electrode connected to a gate line which transfers a scanning signal, a source electrode connected to a data line which transfers a signal applied to a pixel electrode, a drain electrode facing the source electrode, and a semiconductor electrically connected to the source electrode and the drain electrode.

The semiconductor is an important element for determining an element characteristic in the electronic elements, such as the thin film transistor. Silicon (Si) is most frequently used as the semiconductor. The silicon is classified into amorphous silicon and polysilicon according to a crystalline shape, and the manufacturing of a high-performance amorphous silicon element is limited because charge mobility is low while a manufacturing process is simple, and the polysilicon has a complicated manufacturing cost and process because crystallizing the silicon is required while charge mobility is high.

As a result, research has been carried out regarding a thin film transistor using an oxide semiconductor which has high electron mobility and a high on/off ratio of current as compared with amorphous silicon, and has low cost and high uniformity as compared with the polysilicon.

The thin film transistor using the oxide semiconductor may greatly influence an electric characteristic of the thin film transistor including the oxide semiconductor according to a structure thereof, a manufacturing process, a material included in a layer positioned therearound, and the like. Accordingly, development for structure and process of a thin film transistor using a reliable oxide semiconductor has been required.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide a thin film transistor and a manufacturing method thereof having advantages of improving an electric characteristic of a thin film transistor including an oxide semiconductor, simplifying a manufacturing process of the thin film transistor, and reducing manufacturing cost.

Additional features of the invention will be set forth in the description which follows, and in part will be apparent from the description, or may be learned by practice of the invention.

An exemplary embodiment of the present invention discloses a thin film transistor, including: a gate electrode; a gate insulating layer disposed on the gate electrode; a first semiconductor disposed on the gate insulating layer; a second semiconductor disposed on the first semiconductor and having a different plane shape from the first semiconductor; and a source electrode and a drain electrode that are both disposed on the second semiconductor and face each other.

An exemplary embodiment of the present invention also discloses a thin film transistor, including: a gate electrode; a gate insulating layer disposed on the gate electrode; a first semiconductor disposed on the gate insulating layer; a second semiconductor disposed on the first semiconductor; and a source electrode and a drain electrode that are both disposed on the second semiconductor and face each other, in which the first semiconductor includes at least one of indium (In), zinc (Zn), and tin (Sn), and the second semiconductor includes at least one element having greater free energy for oxide formation than indium (In), zinc (Zn), and tin (Sn).

An exemplary embodiment of the present invention also discloses a method of manufacturing a thin film transistor, including: forming a gate electrode on a substrate; forming a first semiconductor on the gate electrode using a first optical mask; forming a second semiconductor having a different plane shape from the first semiconductor on the first semiconductor using a second optical mask; and forming a source electrode and a drain electrode that are both disposed on the second semiconductor and face each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
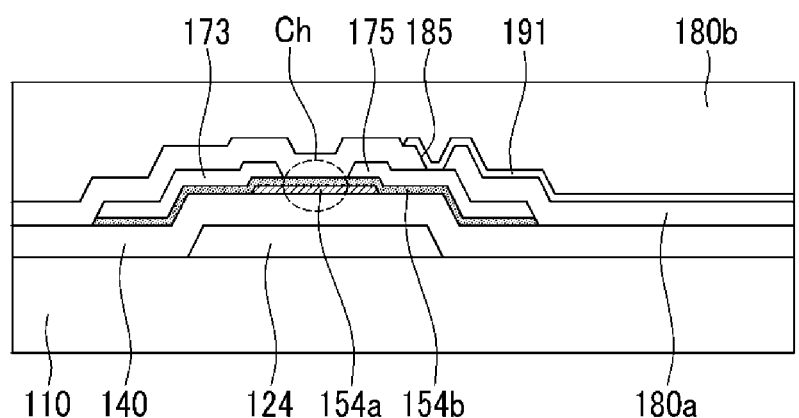
FIG. 1A, FIG. 1B, and FIG. 2 are cross-sectional views of a thin film transistor according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers, regions, films, panels, etc., may be exaggerated for clarity. Like reference numerals denote like elements.

It will be understood that when an element such as a layer, film, region, or substrate is referred to as being "on" or "connected to" another element, it can be directly on or directly connected to the other element, or intervening elements may also be present. In contrast, when an element is referred to as being "directly on" or "directly connected to" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

First, a thin film transistor according to an exemplary embodiment of the present invention will be described with reference to FIGS. 1A and 1B.

Figure 1B:
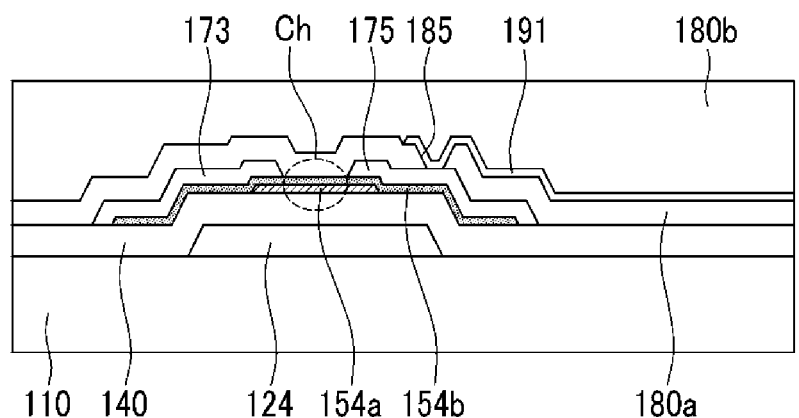

FIGS. 1A and 1B are cross-sectional views of a thin film transistor according to an exemplary embodiment of the present invention.

Referring to FIGS. 1A and 1B, a gate electrode 124 is disposed on a substrate 110 including an insulating material, such as plastic and glass. The gate electrode 124 may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like. The gate electrode 124 may have a multilayered structure including at least two conductive layers having different physical properties. For example, the gate electrode 124 may have a multilayered structure such as Mo/Al/Mo, Mo/Al, Mo/Cu, CuMn/Cu, and Ti/Cu.

A first semiconductor 154a and a second semiconductor 154b including oxide semiconductors are overlapped with the gate electrode 124 with a gate insulating layer 140 therebetween. The first semiconductor 154a and the second semiconductor 154b are in contact with each other and connected to each other. The first semiconductor 154a may be an oxide semiconductor layer which is closer to the gate insulating layer 140 than the second semiconductor 154b.

In an exemplary embodiment, the gate insulating layer 140 may be disposed on the gate electrode 124. The gate insulating layer 140 may comprise an insulating material such as silicon oxide (SiOx), silicon nitride (SiNx), or silicon oxynitride (SiON). The gate insulating layer 140 may be formed by using a sputtering method and the like.

In an exemplary embodiment, the first semiconductor 154a and the second semiconductor 154b may be disposed on the gate insulating layer 140.

In an exemplary embodiment of the present invention illustrated in FIGS. 1A and 1B, the second semiconductor 154b may be disposed on the first semiconductor 154a. In an exemplary embodiment, an edge boundary of the first semiconductor 154a and an edge boundary of the second semiconductor 154b may not be aligned with each other. That is, the first semiconductor 154a and the second semiconductor 154b may have different plane shapes. Here, the term "different plane shapes" means that the first semiconductor 154a and the second semiconductor 154b have different shapes or different sizes when viewed from a normal line of the substrate 110. In a manufacturing process, the first semiconductor 154a and the second semiconductor 154b may be formed by using different optical masks.

According to an exemplary embodiment of the present invention, the first semiconductor 154a is an island type, and the second semiconductor 154b covers at least a part of the first semiconductor 154a. In more detail, as illustrated in FIGS. 1A and 1B, the second semiconductor 154b may cover both the upper surface and the side surface of the first semiconductor 154a.

According to an exemplary embodiment illustrated in FIG. 1B, the second semiconductor 154b may be an island type. The second semiconductor 154b may cover both the side and the top of the first semiconductor 154a, but unlike the embodiment of FIG. 1A, a side surface of the second semiconductor 154b may be covered by source and drain electrodes 173 and 175. As in FIG. 1B, however, an area of the second semiconductor 154b may be greater than an area of the first semiconductor 154a. In FIG. 1A, the second semiconductor 154b, the source electrode 173, and the drain electrode 175 may be formed using the same mask. In FIG. 1B, however, the second semiconductor 154b may be formed using a mask different from the mask used to form the source electrode 173 and the drain electrode 175.

Compositions of the oxide semiconductors included in the first semiconductor 154a and the second semiconductor 154b may be different from each other.

In an exemplary embodiment, the first semiconductor 154a may include at least one of indium (In), zinc (Zn), and tin (Sn). That is, the first semiconductor 154a may include at least one of indium oxide ($In_2O_3$), zinc oxide (ZnO), and tin oxide ($SnO_2$).

In an exemplary embodiment, the second semiconductor 154b may include at least one element having greater free energy for oxide formation than indium (In), zinc (Zn), and tin (Sn). Examples of the element having greater free energy for oxide formation than indium (In), zinc (Zn), and tin (Sn) include silicon (Si), titanium (Ti), gallium (Ga), zirconium (Zr), chromium (Cr), hafnium (Hf), vanadium (V), aluminum (Al), lanthanum (La), cerium (Ce), praseodymium (Pr), neodymium (Nd), niobium (Nb), yttrium (Y), scandium (Sc), tantalum (Ta), and the like.

The second semiconductor 154b may further include at least one of indium (In), zinc (Zn), and tin (Sn), but the content ratio thereof may be less than the content ratio in the first semiconductor 154a. Here, a unit of the content ratio may be expressed in atomic %.

The first semiconductor 154a may further include an element having greater free energy for oxide formation than indium (In), zinc (Zn), and tin (Sn), and the content ratio thereof may be less than the content ratio in the second semiconductor 154b.

The first semiconductor 154a and the second semiconductor 154b may be formed, for example, by an alternating current (AC) or direct current (DC) sputtering method using an oxide semiconductor target.

The second semiconductor 154b may be formed while wet-etching a metal such as copper (Cu) with a wet etching etchant. The metal such as copper (Cu) may be a composition material of a wire to be laminated above the second semiconductor 154b.

The oxide semiconductors included in the first semiconductor 154a and the second semiconductor 154b may be amorphous, crystalline, nano-sized crystalline, or in a state of a mixture of two or more thereof.

Referring to FIGS. 1A and 1B, the source electrode 173 and the drain electrode 175 are disposed on the second semiconductor 154b and connected to the second semiconductor 154b. The source electrode 173 and the drain electrode 175 face each other and are spaced apart from each other on the basis of the second semiconductor 154b.

The source electrode 173 and the drain electrode 175 may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like. For example, the molybdenum alloy may include Mo—Nb and Mo—Ti. The source electrode 173 and the drain electrode 175 may be made of a transparent conductive material such as ITO, IZO, and AZO. The source electrode 173 and the drain electrode 175 may have a multilayered structure including two or more conductive layers (not illustrated). For example, the source electrode 173 and the drain electrode 175 may have a multilayered structure such as Mo/Al/Mo, Mo/Al, Mo/Cu, CuMn/Cu, and Ti/Cu.

The gate electrode 124, the source electrode 173, and the drain electrode 175 form a thin film transistor (TFT) together with a semiconductor layer of the first semiconductor 154a and the second semiconductor 154b. A channel region Ch of the thin film transistor is positioned at the first semiconductor 154a and the second semiconductor 154b between the source electrode 173 and the drain electrode 175.

Referring to FIG. 1A, the plane shape of the second semiconductor 154b, except for the channel region Ch, may be substantially the same as the plane shape of the source electrode 173 and the drain electrode 175. Here, the case where the plane shapes are substantially the same as each other also includes a case where two plane shapes are similar to each other, that is, the two plane shapes are the same but have different sizes.

A barrier layer (not illustrated) including at least one of metals such as molybdenum (Mo), titanium (Ti), and niobium (Nb) may be formed between the second semiconductor 154b, and the source electrode 173 and drain electrode 175.

Although a separate barrier layer is not formed between the second semiconductor 154b and the source electrode 173 and drain electrode 175, in the thin film transistor including the second semiconductor 154b according to an exemplary embodiment of the present invention, a metal component such as copper (Cu) present in the source electrode 173 and the drain electrode 175 may be prevented from being diffused to the second semiconductor 154b and the first semiconductor 154a. Particularly, as illustrated in FIGS. 1A and 1B, in the case where the second semiconductor 154b covers the upper surface and the side surface of the first semiconductor 154a, the metal components of the source electrode 173 and the drain electrode 175 may be more completely prevented from being diffused to the second semiconductor 154b and the first semiconductor 154a. Accordingly, it is possible to prevent deterioration in an electric characteristic of the thin film transistor that is caused when the metal component such as copper (Cu) present in the source electrode 173 and the drain electrode 175 is otherwise diffused to the second semiconductor 154b and the first semiconductor 154a. Further, a deviation of a threshold voltage of the thin film transistor is reduced, thereby increasing photoelectric reliability. As a result, although the source electrode 173 and the drain electrode 175 may be formed by a single layer including only copper (Cu), it is possible to prevent deterioration in a characteristic of the thin film transistor.

The thin film transistor including the first semiconductor 154a and the second semiconductor 154b according to an exemplary embodiment of the present invention may have high mobility in addition to improvement of the electric characteristic. In particular, the first semiconductor 154a having a composition according to an exemplary embodiment of the present invention may have higher mobility than the second semiconductor 154b.

The second semiconductor 154b according to an exemplary embodiment of the present invention may prevent a semiconductor characteristic from deteriorating or the channel region Ch from being damaged as a result of the diffusion of an impurity to the first semiconductor 154a and the second semiconductor 154b in a laminating process of another layer disposed on the second semiconductor 154b, and may have high mobility. Accordingly, a separate passivation layer, such as an etch stop layer, need not be formed in order to protect the channel region Ch of the first semiconductor 154a and the second semiconductor 154b. The effect may also be obtained in the case where the second semiconductor 154b covers the upper surface and the side surface of the first semiconductor 154a, such as in the exemplary embodiment illustrated in FIG. 1A described above.

A first passivation layer 180a may be formed on the source electrode 173, the drain electrode 175, and the exposed second semiconductor 154b of the thin film transistor according to an exemplary embodiment of the present invention. The first passivation layer 180a may include a contact hole 185 exposing the drain electrode 175. The first passivation layer 180a may be made of an inorganic insulator such as silicon nitride (SiNx) or silicon oxide (SiOx), an organic insulator, a low dielectric insulator, and the like.

A pixel electrode 191 may be disposed on the first passivation layer 180a. The pixel electrode 191 may be made of a transparent conductive material, such as ITO or IZO, or a reflective metal such as aluminum, silver, chromium, or an alloy thereof. The pixel electrode 191 may be electrically and physically connected with the drain electrode 175 in the contact hole 185.

A second passivation layer 180b made of an organic insulator and having a planarization characteristic may be further disposed on the pixel electrode 191 and the first passivation layer 180a.

A structure of the thin film transistor according to an exemplary embodiment of the present invention has been described above, but the structure of the thin film transistor is not limited thereto. The first semiconductor 154a and the second semiconductor 154b having the composition limit and the feature according to an exemplary embodiment of the present invention described above may be applied to a thin film transistor according to various structures and various manufacturing methods.

Next, the thin film transistor according to an exemplary embodiment of the present invention will be described with reference to FIG. 2.

Like reference numerals designate like constituent element of an exemplary embodiment described above, and the same description is omitted.

Figure 2:
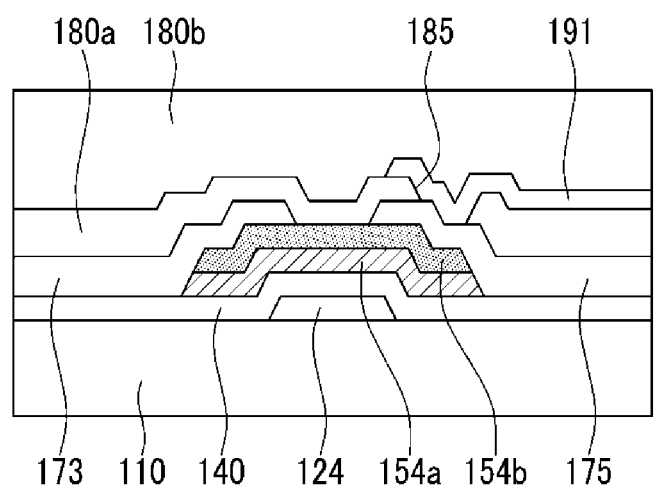

FIG. 2 is a cross-sectional view of the thin film transistor according to an exemplary embodiment of the present invention.

The thin film transistor according to an exemplary embodiment is almost the same as an exemplary embodiment illustrated in FIGS. 1A and 1B described above, except that the second semiconductor 154b may expose at least a portion of the upper surface and the side surface of the first semiconductor 154a. For example, the second semiconductor 154b substantially covers the upper surface of the first semiconductor 154a, but may expose the side surface of the first semiconductor 154a. In this case, the plane shapes of the first semiconductor 154a and the second semiconductor 154b may be substantially the same as, or similar to, each other.

In the exemplary embodiment shown in FIG. 2, the compositions of the first semiconductor 154a, the second semiconductor 154b, the source electrode 173, and the drain electrode 175 are the same as the corresponding elements in the exemplary embodiment described above.

Accordingly, the thin film transistor according to an exemplary embodiment of the present invention may have high mobility, and it is possible to prevent deterioration in an electric characteristic of the thin film transistor that may be caused when the metal component of the source electrode 173 and the drain electrode 175 is diffused to the second semiconductor 154b and the first semiconductor 154a. Further, a deviation of a threshold voltage of the thin film transistor is reduced, thereby increasing photoelectric reliability. As a result, as in the exemplary embodiment described above, although the source electrode 173 and the drain electrode 175 are formed by a single layer including only copper (Cu), it is possible to prevent deterioration in a characteristic of the thin film transistor.

The effects will be described with reference to FIGS. 3 and 4.

Figure 3:
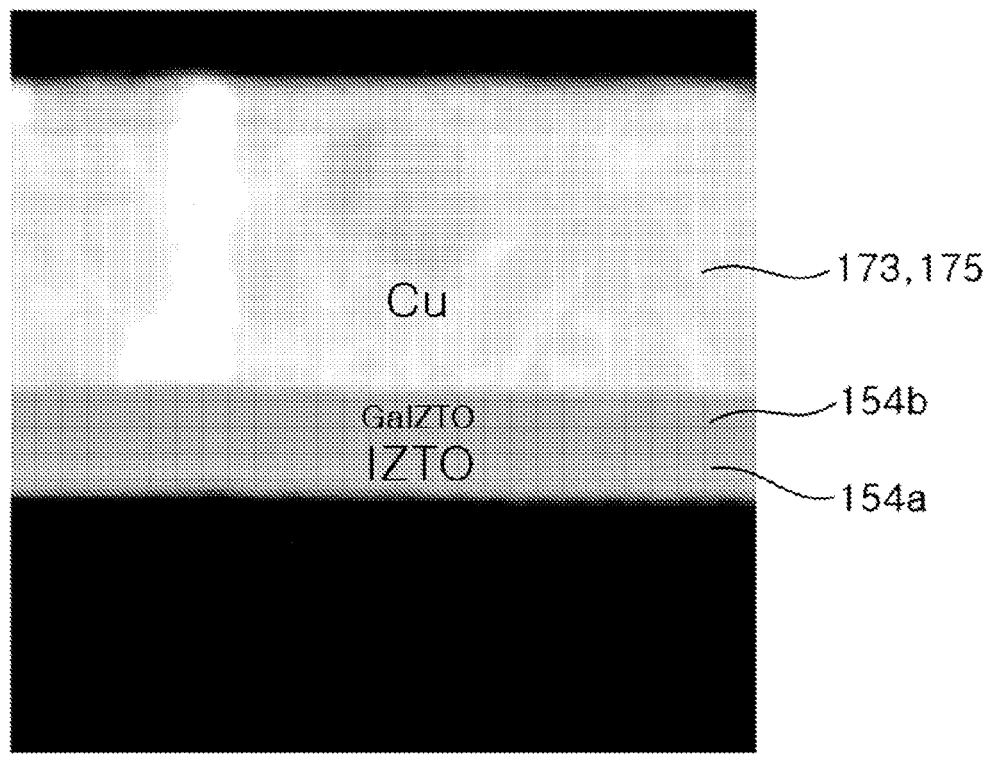
FIG. 3 is an electron micrograph illustrating a cross-section of the thin film transistor according to an exemplary embodiment of the present invention.
Figure 4:
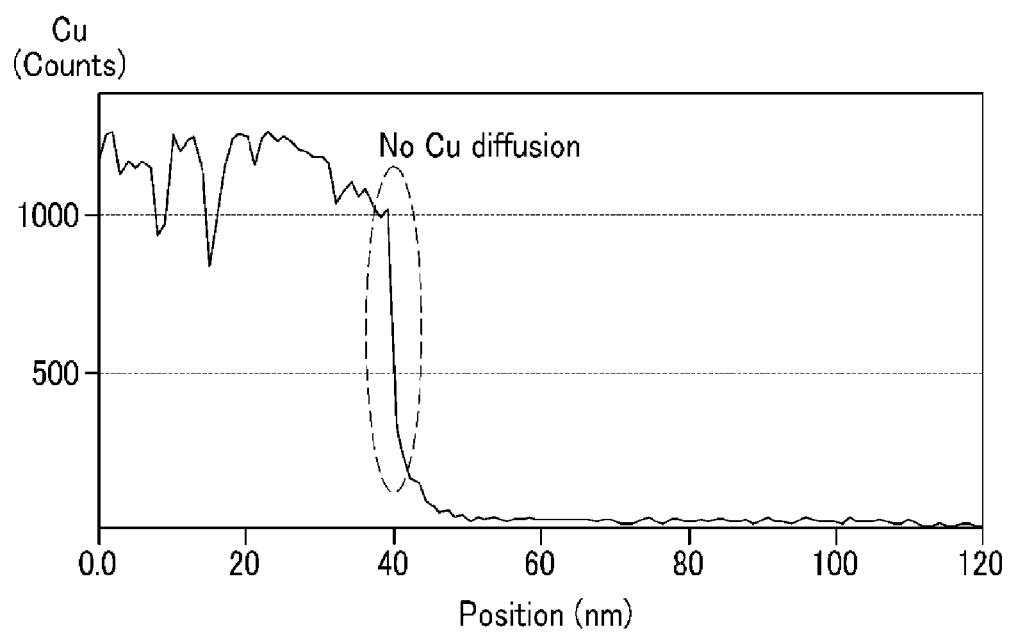
FIG. 4 is a graph illustrating a distribution of copper (Cu) measured along the cross-section of the thin film transistor illustrated in FIG. 3.

FIG. 3 is an electron micrograph illustrating a cross-section of the thin film transistor according to an exemplary embodiment of the present invention, and FIG. 4 is a graph illustrating a distribution of copper (Cu) measured along the cross-section of the thin film transistor illustrated in FIG. 3.

The thin film transistor illustrated in FIG. 3 is the thin film transistor according to the exemplary embodiment illustrated in FIGS. 1A to 2, and an example in which the source electrode 173 and the drain electrode 175 include copper (Cu), the first semiconductor 154a includes oxides of indium (In), zinc (Zn), and tin (Sn), and the second semiconductor 154b includes gallium (Ga) in addition to the oxide of indium (In), zinc (Zn), and tin (Sn) is illustrated. In a graph illustrated in FIG. 4, a position of 0 nm to about 40 nm corresponds to a place where the source electrode 173 and the drain electrode 175 are disposed, and a position of about 40 nm or more corresponds to the second semiconductor 154b and the first semiconductor 154a and a layer disposed therebelow.

As illustrated in FIG. 4, even in the case where the source electrode 173 and the drain electrode 175 include copper (Cu) in the thin film transistor according to an exemplary embodiment of the present invention, the copper (Cu) is not nearly as diffused to the first semiconductor 154a and the second semiconductor 154b.

A method of manufacturing a thin film transistor according to another exemplary embodiment of the present invention will be described with reference to FIGS. 5 to 13.

FIGS. 5 to 13 are cross-sectional views sequentially illustrating a method of manufacturing a thin film transistor according to another exemplary embodiment of the present invention.

Figure 5:
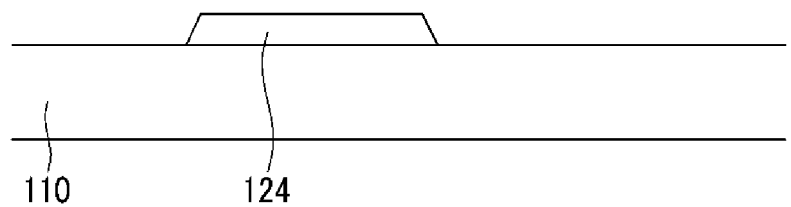
FIG. 5, FIG. 6, FIG. 7, FIG. 8, FIG. 9, FIG. 10, FIG. 11, FIG. 12, and FIG. 13 are cross-sectional views sequentially illustrating a method of manufacturing a thin film transistor according to another exemplary embodiment of the present invention.

Referring to FIG. 5, a conductive material is laminated on a substrate 110 including an insulating material such as plastic and glass, and a gate electrode 124 is formed by a photolithography method and the like. In this case, one optical mask may be used.

Figure 6:
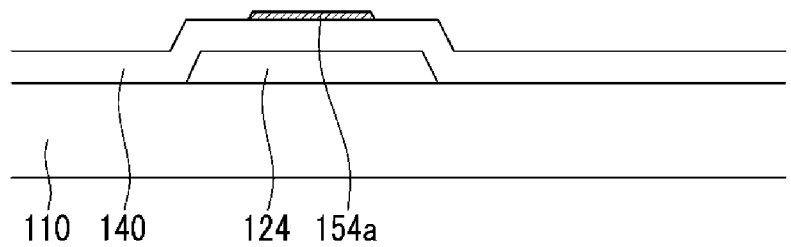

Referring to FIG. 6, a gate insulating layer 140 made of an insulating material such as silicon oxide (SiOx), silicon nitride (SiNx), or silicon oxynitride (SiON) is formed on the gate electrode 124.

An oxide semiconductor including at least one of indium (In), zinc (Zn), and tin (Sn) is laminated on a gate insulating layer 140 by a sputtering method and the like and patterned by a photolithography method and the like to form an island-shaped first semiconductor 154a. In this case, one optical mask may be used.

Figure 7:
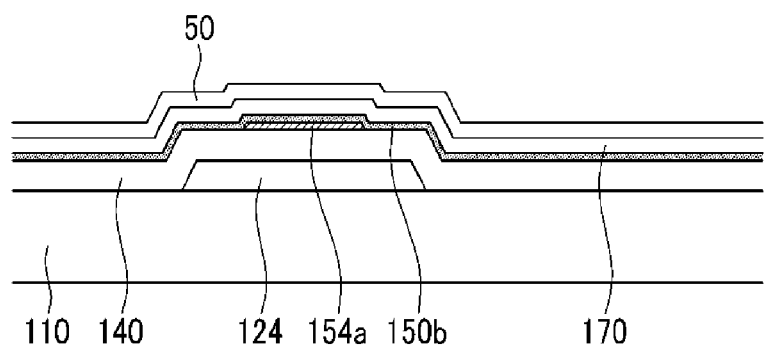

Referring to FIG. 7, a second semiconductor layer 150b and a conductive layer 170 are sequentially laminated on the gate insulating layer 140 and the first semiconductor 154a.

In the second semiconductor layer 150b, an oxide semiconductor including at least one of silicon (Si), titanium (Ti), gallium (Ga), zirconium (Zr), chromium (Cr), hafnium (Hf), vanadium (V), aluminum (Al), lanthanum (La), cerium (Ce), praseodymium (Pr), neodymium (Nd), niobium (Nb), yttrium (Y), scandium (Sc), and tantalum (Ta) may be laminated by a sputtering method and the like.

The conductive layer 170 may be formed by a sputtering method and the like using a target made of a metal such as copper (Cu).

A photosensitive film 50 is then coated on the conductive layer 170.

Figure 8:
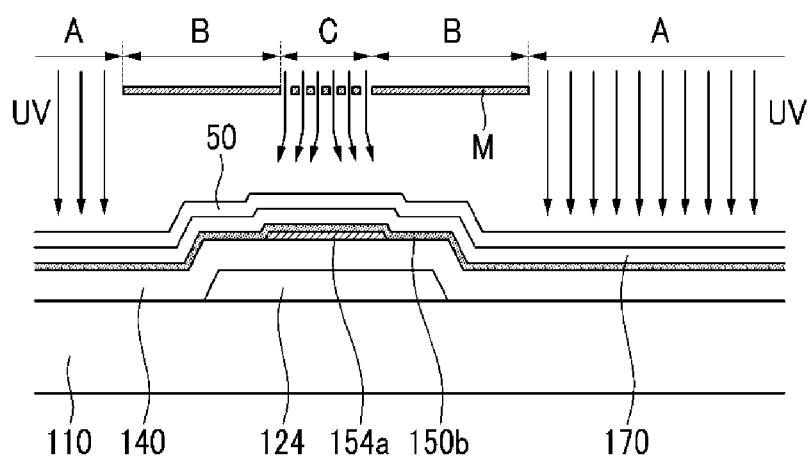

Referring to FIG. 8, an optical mask M is disposed on the photosensitive film 50 to irradiate light such as ultraviolet rays (UV). A region A of the optical mask M is transparent to transmit light, a region B is opaque to prevent transmission of light, and a region C is translucent to partially transmit light. In the region C of the optical mask M, a slit or lattice-shaped pattern may be formed, or a translucent layer may be used, in order to control a light transmitting amount. In this case, the photosensitive film 50 may have positive photosensitivity such that a portion where light is irradiated is removed.

Figure 9:
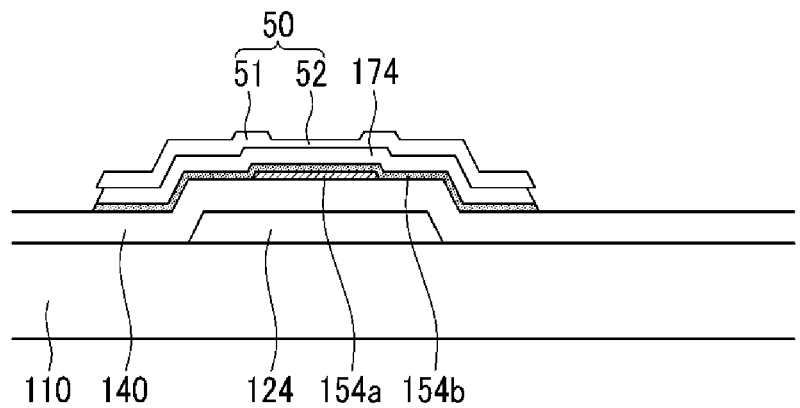

When the light is irradiated through the optical mask M, as illustrated in FIG. 9, the photosensitive film 50 facing the region A of the optical mask M is removed, the photosensitive film 50 facing the region B remains, and only a part of the photosensitive film 50 facing the region C may be removed according to an exposure amount. Accordingly, the exposed photosensitive film 50 includes a first portion 51 having a relatively large thickness and a second portion 52 having a relatively small thickness.

In the case where the photosensitive film 50 has negative photosensitivity, transparencies of the regions A and B of the optical mask M may be reversed.

Referring to FIG. 9, the second semiconductor layer 150b and the conductive layer 170 are etched by using the photosensitive film 50 including the first portion 51 and the second portion 52 as an etching mask to form the second semiconductor 154b and the conductor layer 174. In this case, a wet-etching method may be used, and a used etchant may be an etchant capable of etching the conductive layer 170 and the second semiconductor layer 150b together.

Figure 10:
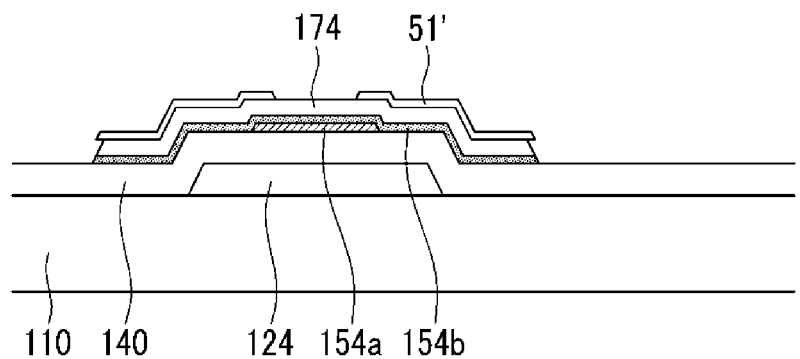

Referring to FIG. 10, the photosensitive film 50 is ashed or dry-etched to remove the second portion 52 having the relatively small thickness. In this case, the first portion 51 is partially etched, in an amount equal to about the thickness of the second portion 52, to form a photosensitive film 51'.

Figure 11:
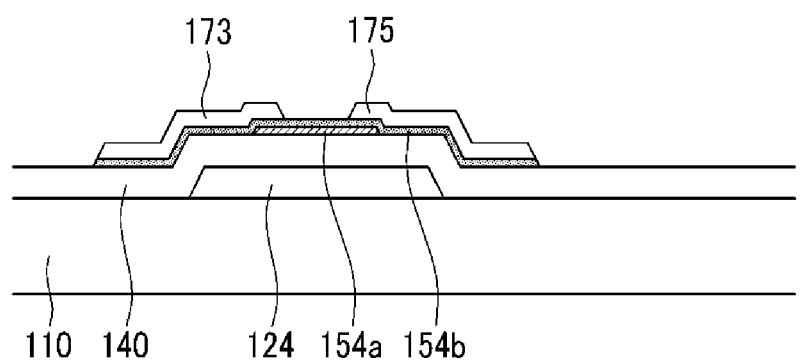

Referring to FIG. 11, the conductor layer 174 is etched by using the photosensitive film 51' as an etching mask to form a source electrode 173 and a drain electrode 175 which are spaced apart from each other on the second semiconductor 154b and expose a part of the second semiconductor 154b.

Subsequently, the photosensitive film 51' is removed.

Alternatively, the second semiconductor layer 150b may be formed on the substrate and before the conductive layer 170 is formed thereon, the second semiconductor layer 150b may be patterned using a mask to form the second semiconductor 154b. Next, the conductive layer 170 may be formed on the second semiconductor 154b and patterned using a different mask than that used to pattern the second semiconductor layer 150b, thereby forming the source and drain electrodes 173 and 175 on the upper surface and side surface of the second semiconductor 154b, as shown in FIG. 1B.

Figure 12:
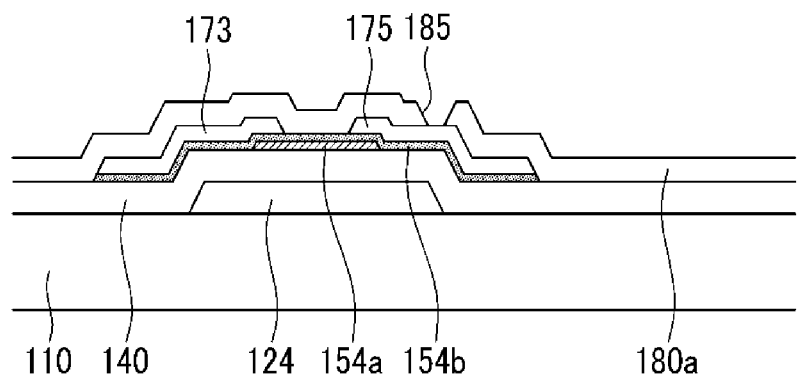

After the photosensitive film 51' is removed, referring to FIG. 12, an insulating material such as silicon oxide (SiOx) and silicon nitride (SiNx) is coated on the source electrode 173 and the drain electrode 175 by a chemical vapor deposition (CVD) method and the like, and patterned by a photolithography method and the like to form a first passivation layer 180a including a contact hole 185 exposing the drain electrode 175. In this case, one optical mask may be used.

Figure 13:
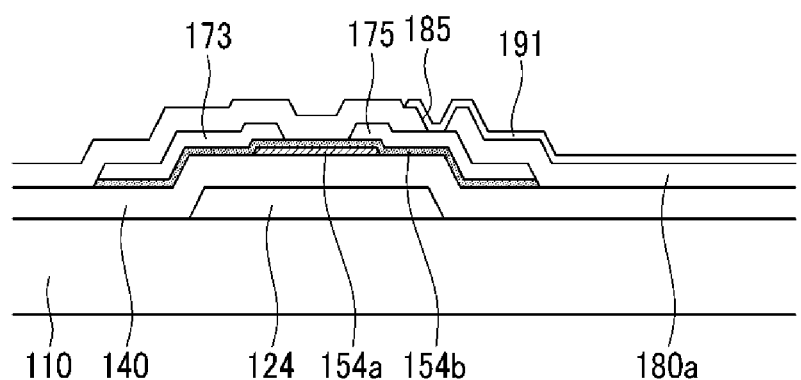

Next, referring to FIG. 13, a pixel electrode 191, which is physically and electrically in contact with the drain electrode 175 through the contact hole 185, is formed on the first passivation layer 180a by a photolithography method and the like. In this case, one optical mask may be used.

As illustrated in FIGS. 1A to 2 described above, an organic insulating material is laminated on the first passivation layer 180a and the pixel electrode 191 to further form a second passivation layer 180b.

According to the manufacturing method according to an exemplary embodiment, a thin film transistor having the cross-sectional structure, as illustrated in FIG. 1A described above, may be manufactured. As a result, because the thin film transistor which includes the first semiconductor 154a and the second semiconductor 154b having different plane shapes may be manufactured by using as few optical masks as possible, a manufacturing process may be simplified and manufacturing costs may be reduced.

Because the second semiconductor 154b mostly covering the first semiconductor 154a includes oxide including at least one element having greater free energy for oxide formation than indium (In), zinc (Zn), and tin (Sn), it is possible to prevent impurities, such as the etchant and various gases, from being diffused to the first semiconductor 154a and the second semiconductor 154b in a process of forming a layer disposed on the second semiconductor 154b. Accordingly, it is possible to prevent an electric characteristic, such as photoelectric reliability of the thin film transistor, from deteriorating. Further, a separate passivation layer, such as an etch stopper for protecting the channel regions Ch of the first semiconductor 154a and the second semiconductor 154b, need not be formed on the second semiconductor 154b.

A thin film transistor array panel including the thin film transistor according to an exemplary embodiment of the present invention will be described with reference to FIGS. 14 to 15.

Figure 14:
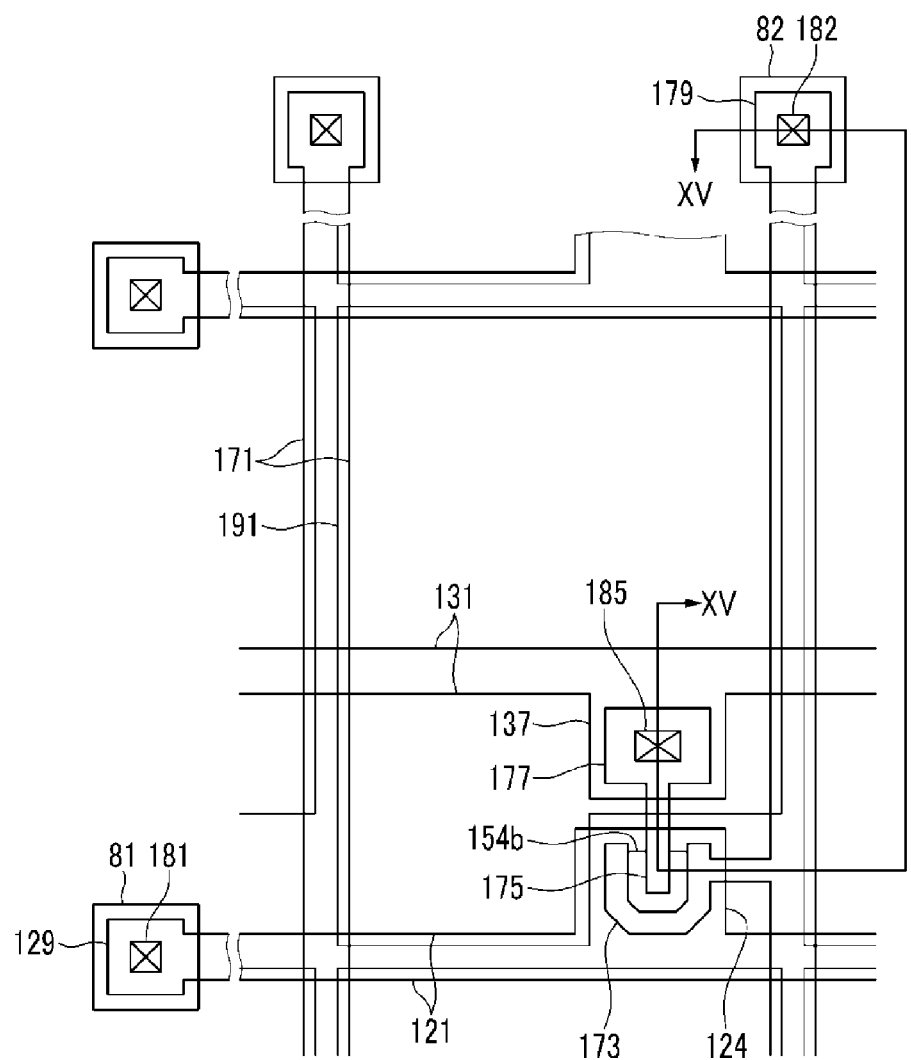
FIG. 14 is a layout view of a thin film transistor array panel and a display device including the same according to another exemplary embodiment of the present invention.
Figure 15:
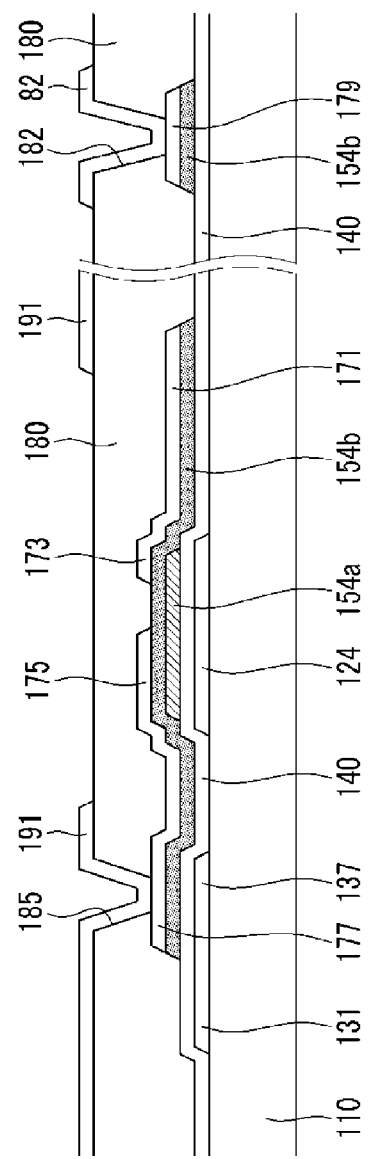
FIG. 15 is an example of a cross-sectional view of the thin film transistor array panel of FIG. 14 taken along line XV-XV.

FIG. 14 is a layout view of a thin film transistor array panel and a display device including the same according to another exemplary embodiment of the present invention, and FIG. 15 is an example of a cross-sectional view of the thin film transistor array panel of FIG. 14 taken along line XV-XV.

In an exemplary embodiment, the thin film transistor array panel of a liquid crystal display is illustrated, but the thin film transistor array panel according to an exemplary embodiment of the present invention may be applied to various flat panel displays such as an organic light emitting diode display.

First, a gate line 121 and a storage electrode line 131 are disposed on an insulation substrate 110 made of glass, plastic, or the like.

The gate line 121 transfers a gate signal, may extend substantially in a row direction, and may include a plurality of gate electrodes 124. Further, the gate line 121 includes an end portion 129. However, the end portion 129 of the gate line 121 may be omitted.

The storage electrode line 131 receives a predetermined voltage, may extend substantially in parallel to the gate line 121, and includes a storage electrode 137. Shapes and layouts of the storage electrode line 131 and the storage electrode 137 may be variously modified. The storage electrode line 131 may be omitted.

The gate line 121 and the storage electrode line 131 may be made of an aluminum-based metal such as aluminum (Al) or an aluminum alloy, a silver-based metal such as silver (Ag) or a silver alloy, a copper-based metal such as copper (Cu) or a copper alloy such as a copper-manganese alloy, a molybdenum-based metal such as molybdenum (Mo) or a molybdenum alloy, chromium (Cr), tantalum (Ta), titanium (Ti), and the like. Further, the gate line 121 and the storage electrode line 131 may be made of a transparent conductive material such as ITO, IZO, and AZO. The gate line 121 and the storage electrode line 131 may have a multilayered structure including two or more conductive layers (not illustrated).

A gate insulating layer 140 is disposed on the gate line 121 and the storage electrode line 131. The gate insulating layer 140 may include silicon nitride, silicon oxide, SiON, an organic insulating material, and the like. The gate insulating layer 140 may have a multilayered structure including two or more insulating layers (not illustrated). For example, an upper portion of the gate insulating layer 140 may be SiOx and a lower portion may be SiNx, or the upper portion may be SiOx and the lower portion may be SiON.

An island-shaped first semiconductor 154a including an oxide semiconductor and a second semiconductor 154b covering at least a part of the first semiconductor 154a are disposed on the gate insulating layer 140. Features such as the structures and the compositions of the first semiconductor 154a and the second semiconductor 154b are the same as an exemplary embodiments illustrated in FIGS. 1A to 2 described above, and the detailed description thereof is omitted.

A data line 171 and a drain electrode 175 are disposed on the second semiconductor 154b.

The data line 171 transfers a data voltage and substantially extends in a column direction to cross the gate line 121. The data line 171 includes an end portion 179 and may include a source electrode 173, which is curved in a "U" shape, on the gate electrode 124. The shape of the source electrode 173 may be variously modified.

The drain electrode 175 is separated from the data line 171 and may include a rod-shaped end portion surrounded by the source electrode 173 and an extension 177 of the other end portion. The extension 177 may be overlapped with the storage electrode 137.

The data line 171 and the drain electrodes 175 and 177 may be made of an aluminum-based metal such as aluminum (Al) or an aluminum alloy, a silver-based metal such as silver (Ag) or a silver alloy, a copper-based metal such as copper (Cu) or a copper alloy such as a copper-manganese alloy, a molybdenum-based metal such as molybdenum (Mo) or a molybdenum alloy, chromium (Cr), tantalum (Ta), titanium (Ti), and the like. For example, the molybdenum alloy may include Mo—Nb and Mo—Ti. Further, the data line 171 and the drain electrodes 175 and 177 may be made of a transparent conductive material such as ITO, IZO, and AZO. The data line 171 and the drain electrodes 175 and 177 may have a multilayered structure including two or more conductive layers (not illustrated).

The gate electrode 124, the source electrode 173, and the drain electrode 175 form a thin film transistor (TFT) together with the first semiconductor 154*a* and the second semiconductor 154*b*, and a channel region of the thin film transistor is positioned at the first semiconductor 154*a* and the second semiconductor 154*b* between the source electrode 173 and the drain electrode 175.

The second semiconductor 154*b*, the data line 171, and the drain electrode 175 may have substantially the same plane shape as each other except for the channel region of the thin film transistor. Alternatively, the second semiconductor 154*b*, the data line 171, and the drain electrode 175 may be formed as disclosed in FIG. 1B.

A passivation layer 180 made of an inorganic or organic insulating material is disposed on the data line 171 and the drain electrode 175. The passivation layer 180 may be formed as a multilayer. For example, a lower portion of the passivation layer 180 may be SiOx and an upper portion may be SiNx, or the lower portion may be SiOx and the upper portion may be SiON.

The passivation layer 180 includes a contact hole 185 exposing the drain electrode 175 and a contact hole 182 exposing the end portion 179 of the data line. Further, the passivation layer 180 and the gate insulating layer 140 include a contact hole 181 exposing the end portion 129 of the gate line 121.

A pixel electrode 191 and contact assistants 81 and 82 are disposed on the passivation layer 180. The pixel electrode 191 and the contact assistants 81 and 82 may be made of a transparent conductive material including ITO, IZO, or the like. The pixel electrode 191 is electrically connected to the drain electrode 175 in the contact hole 185 to receive a data voltage. The contact assistant 81 is disposed on the end portion 129 of the gate line and connected to the end portion 129 of the gate line through the contact hole 181. The contact assistant 82 is disposed on the end portion 179 of the data line and connected to the end portion 179 of the data line through the contact hole 182.

The method of manufacturing the thin film transistor may be based on the manufacturing method illustrated in FIGS. 5 to 13 described above.

A display device including a thin film transistor according to exemplary embodiment of the present invention will now be described with reference to FIGS. 14 and 16.

Figure 16:
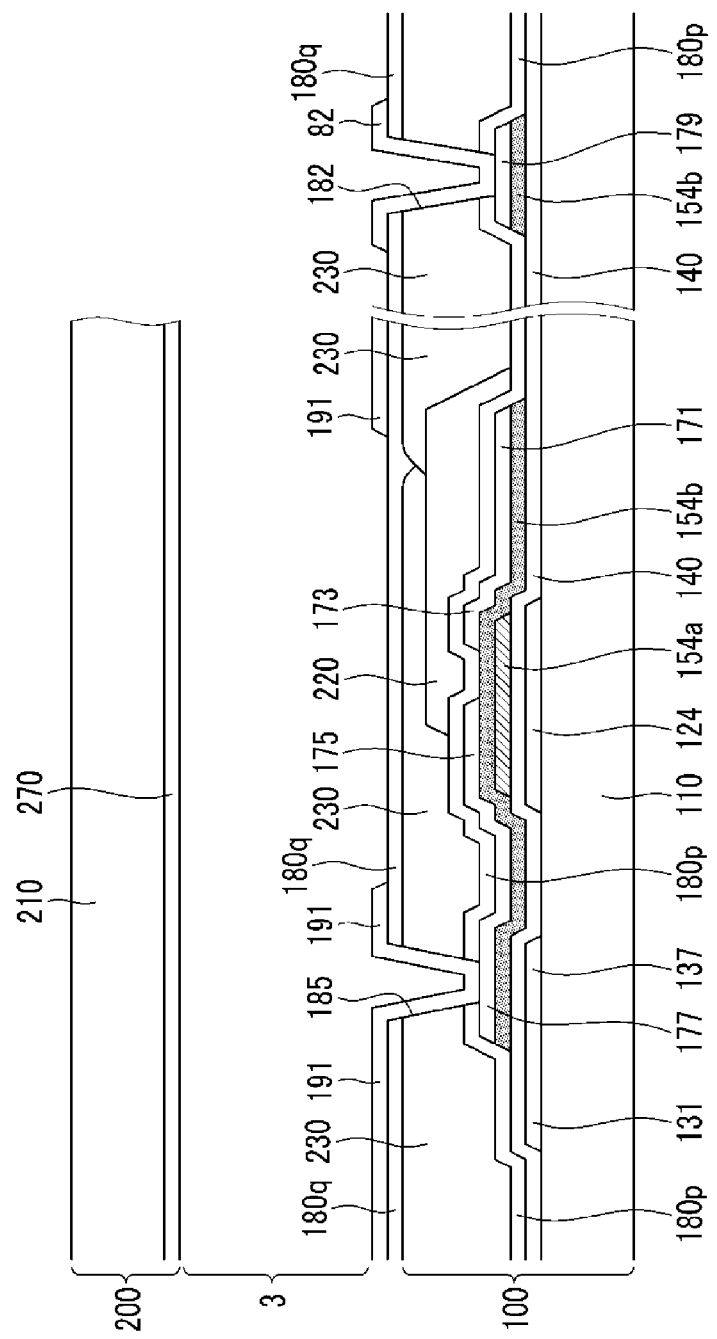
FIG. 16 is an example of a cross-sectional view of the display device including the thin film transistor array panel of FIG. 14 taken along line XV-XV.

FIG. 16 is an example of a cross-sectional view of the display device including the thin film transistor array panel of FIG. 14 taken along line XV-XV.

The display device according to an exemplary embodiment may include a lower panel 100 and an upper panel 200 facing each other, and a liquid crystal layer 3 interposed therebetween.

The lower panel 100 according to this exemplary embodiment, as a thin film transistor array panel, is almost the same as the exemplary embodiment illustrated in FIG. 15 described above, but may further include a light blocking member 220 and a color filter 230. Further, the passivation layer 180 may include a lower passivation layer 180*p* and an upper passivation layer 180*q*. The light blocking member 220 and the color filter 230 may be disposed between the lower passivation layer 180*p* and the upper passivation layer 180*q*.

When describing the upper panel 200, an opposed electrode 270 is disposed on a substrate 210 facing the substrate 110 of the lower panel 100. The opposed electrode 270 generates an electric field in the liquid crystal layer 3 together with the pixel electrode 191 to control an alignment of liquid crystal molecules.

Although not illustrated in FIG. 16, at least one of the light blocking member 220 and the color filter 230 may be disposed on the lower panel 100.

In FIGS. 15 and 16, as in FIG. 1A described above, an example in which the plane shapes of the second semiconductor 154*b*, the source electrode 173, and the drain electrode 175 are substantially the same as each other is illustrated, but the present invention is not limited thereto and may have the same structure as the exemplary embodiment illustrated in FIG. 1B, or 2.

Figure 17:
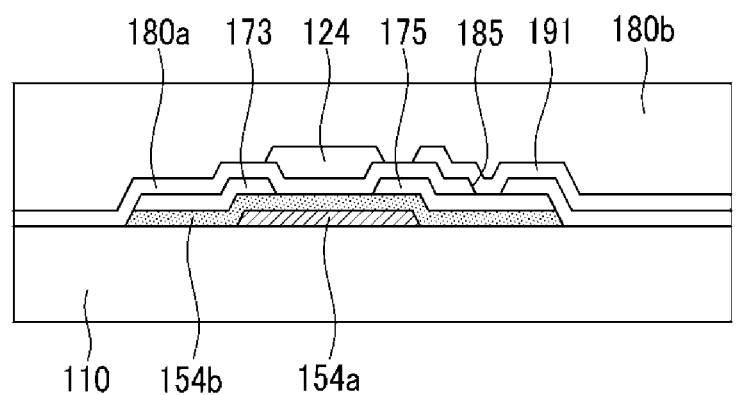
FIG. 17 is a cross-sectional view of a top gate thin film transistor according to another exemplary embodiment of the present invention.

Although the above exemplary embodiments of the invention show a bottom gate TFT, exemplary embodiments of the invention can also be applied to a top gate TFT, as shown in FIG. 17, where gate electrode 124, the source electrode 173, and the drain electrode 175 form a thin film transistor (TFT) together with the first semiconductor 154*a* and the second semiconductor 154*b*, and a channel region of the thin film transistor is positioned at the first semiconductor 154*a* and the second semiconductor 154*b* between the source electrode 173 and the drain electrode 175.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their is equivalents.

What is claimed is:

1. A thin film transistor, comprising:
a gate electrode;
a gate insulating layer disposed on the gate electrode;
a first semiconductor disposed on the gate insulating layer;
a second semiconductor disposed on the first semiconductor and having a different plane shape than the first semiconductor; and
a source electrode and a drain electrode that are disposed on the second semiconductor and face each other,
wherein the second semiconductor covers an upper surface and all side surfaces of the first semiconductor.

2. The thin film transistor of claim 1, wherein:
the first semiconductor is an island type.

3. The thin film transistor of claim 2, wherein a plane shape of the source electrode and the drain electrode is substantially the same as a plane shape of the second semiconductor except for a channel region.

4. The thin film transistor of claim 3, wherein:
the first semiconductor comprises at least one of indium (In), zinc (Zn), and tin (Sn); and
the second semiconductor comprises at least one element having greater free energy for oxide formation than indium (In), zinc (Zn), and tin (Sn).

5. The thin film transistor of claim 4, wherein:
the second semiconductor comprises at least one of silicon (Si), titanium (Ti), gallium (Ga), zirconium (Zr), chromium (Cr), hafnium (Hf), vanadium (V), aluminum (Al), lanthanum (La), cerium (Ce), praseodymium (Pr), neodymium (Nd), niobium (Nb), yttrium (Y), scandium (Sc), and tantalum (Ta).

6. The thin film transistor of claim 5, wherein:
the second semiconductor further comprises at least one of indium (In), zinc (Zn), and tin (Sn); and a content ratio of at least one of indium (In), zinc (Zn), and tin (Sn) comprising the second semiconductor is less than a content ratio of at least one of indium (In), zinc (Zn), and tin (Sn) comprising the first semiconductor.

7. The thin film transistor of claim 6, wherein:

the source electrode and the drain electrode comprise copper (Cu).

8. The thin film transistor of claim 1, wherein:

a plane shape of the source electrode and the drain electrode is substantially the same as a plane shape of the second semiconductor except for a channel region.

9. The thin film transistor of claim 1, wherein:

the first semiconductor comprises at least one of indium (In), zinc (Zn), and tin (Sn); and the second semiconductor comprises at least one element having greater free energy for oxide formation than indium (In), zinc (Zn), and tin (Sn).

10. The thin film transistor of claim 9, wherein:

the second semiconductor further comprises at least one of indium (In), zinc (Zn), and tin (Sn); and a content ratio of at least one of indium (In), zinc (Zn), and tin (Sn) comprising the second semiconductor is less than a content ratio of at least one of indium (In), zinc (Zn), and tin (Sn) comprising the first semiconductor.

11. The thin film transistor of claim 1, wherein:

the source electrode and the drain electrode comprise copper (Cu).

12. The thin film transistor of claim 2, wherein:

the second semiconductor covers an upper surface of the first semiconductor and exposes a side surface of the first semiconductor.

13. The thin film transistor of claim 1, wherein the second semiconductor directly contacts the gate insulating layer.

14. A thin film transistor, comprising:

a gate electrode;

a gate insulating layer disposed on the gate electrode;

a first semiconductor disposed on the gate insulating layer;

a second semiconductor disposed on the first semiconductor; and a source electrode and a drain electrode that are disposed on the second semiconductor and face each other, wherein:

the first semiconductor comprises at least one of indium (In), zinc (Zn), and tin (Sn);

the second semiconductor comprises at least one element different from indium (In), zinc (Zn), tin (Sn), and oxygen (O), the at least one element having greater free energy for oxide formation than indium (In), zinc (Zn), and tin (Sn); and the second semiconductor directly contacts the gate insulating layer.

15. The thin film transistor of claim 14, wherein:

the source electrode and the drain electrode comprise copper (Cu).

16. The thin film transistor of claim 15, wherein:

the second semiconductor covers an upper surface and a side surface of the first semiconductor.

* * * * *